United States Patent
Smedley

[11] Patent Number: 5,559,467
[45] Date of Patent: Sep. 24, 1996

[54] DIGITAL, PULSE WIDTH MODULATION AUDIO POWER AMPLIFIER WITH NOISE AND RIPPLE SHAPING

[75] Inventor: Keyue M. Smedley, Irvine, Calif.

[73] Assignee: The Regents of the University of California, Oakland, Calif.

[21] Appl. No.: 379,800

[22] Filed: Jan. 27, 1995

[51] Int. Cl.⁶ .................. H03F 3/38; H03F 1/30
[52] U.S. Cl. .................. 330/10; 330/149
[58] Field of Search ............ 330/10, 149, 207 A, 330/251, 297; 332/107, 109

[56] References Cited

U.S. PATENT DOCUMENTS 5,150,072  9/1992  Malec ........................... 330/149

Primary Examiner—Steven Mottola
Attorney, Agent, or Firm—Daniel L. Dawes

[57] ABSTRACT

A digital pulse-width modulated method and apparatus is described which is characterized by noise and ripple shaping for purposes of high-fidelity digital power amplification. A sampled power source amplitude signal is used to shape an interpolated input digital signal in a divider, which is then fed to a noise shaper to produce a lower bit digital signal to represent the original input signal. The output power signal is not affected by the requantization error or the power source ripple. Therefore, DC power regulators normally employed in digital pulse-width modulated audio power amplifiers can be entirely eliminated without sacrificing the signal-to-noise ratio.

20 Claims, 8 Drawing Sheets

DIGITAL, PULSE WIDTH MODULATION AUDIO POWER AMPLIFIER WITH NOISE AND RIPPLE SHAPING

BACKGROUND OF THE INVENTION

1. Field of the Invention

The invention relates to the field of digital amplifier design and more particularly to digital pulse width modulated (PWM) amplifiers powered by sources having power source ripple which is compensated for by the amplifier design.

2. Description of Prior Art

PWM audio power amplifiers have become important in the last decade due to their high efficiency and wide dynamic range. The input audio signals for such power amplifiers can be analog or digital. Digital audio has found increasingly wide applications due to the success of digital storage media and the advances of digital signal processing technology. A digital-PWM power amplifier for audio amplification is preferred, since it eliminates the need for an extra digital-to-analog converter, associated sampling and hold circuitry, and an analog low-pass output filter with a very sharp cutoff as are needed in a conventional digital-analog PWM amplifier. By using a digital-PWM power amplifier the high fidelity of the pulse code modulated (PCM) audio signal can be maintained all the way to the analog loud speakers.

Conventional digital-PWM power amplifiers rely on high-precision DC power sources to obtain high fidelity. These power amplifiers transmit any ripple in the power source to the output, thereby causing signal distortion at the speaker. Consequently, high precision DC power sources are required in order to obtain high signal-to-noise ratios. These DC power sources usually comprise a rectifier, low-pass filter and a regulator. The higher the desired precision for the power amplifier, the larger the capacitance or inductance required in low-pass power filter and the regulator. This then requires large, expensive and often nonlinear discrete components.

The reduction of distortion in power amplifiers is a well recognized need and several approaches have been devised in an attempt to realize it. Swanson et al., "*Method and Apparatus for Reducing Distortion in Amplifiers,*" U.S. Pat. No. 4,737,731 (1988) shows an analog circuit for reducing distortion due to noise on the DC power supply line and amplifiers. In the amplitude modulator of FIG. 2, divider 26 is employed to divide the incoming audio frequency signal from source 12 by V1, a signal which is proportional to that provided by the DC source 24. The output of divider 26 is then amplified by high powered audio amplifier 14.

Swanson's express purpose for including divider 26 is to eliminate distortion caused by noise on the DC power line, one component of which is the AC ripple resident on that line. Swans does not contemplate the use of switched amplifiers and it implements the distortion reducing feedback in analog circuitry.

Swanson, "*Pulse Duration Amplifier System Having Distortion Reduction,*" U.S. Pat. No. 5,216,376 (1993) shows in FIG. 1 an amplifier system having a feedback voltage Vs from the outputs of pulse duration modulation amplifiers 10, 12, 14 and 16 which are provided to divider 96. The input audio voltage Va is combined by divider 96 with the feedback voltage Vs such that the voltage of the signal fed into PDM amplifiers 10, 12, 14 and 16 is ratio Va/Vs. The effect of this division is to cancel the variations of the system's output signal due to the B+ supply line voltage variation, as well as variations due to fluctuating impedance when the various power amplifiers are turned on.

Swanson, "*Power Amplifier System Having Improved Distortion Reduction,*" U.S. Pat. No. 5,132,637 (1992), is cumulative in his teaching although it shows the same principle used in a different circuit. In this case, feedback is provided to divider 254 from a plurality of amplifiers PA.

Covill, "*AM Pulse Duration Modulator,*" U.S. Pat. No. 4,605,910 (1986), shows a PWM circuit including an improvement to reduce harmonic distortion caused by the AC ripple voltage on the DC voltage supply line. The modulator diagram to FIG. 2 combines a reciprocal of the supply voltage with the modulating signal. Multiplier 20 and operational amplifier 18 together form a divider circuit which divides a multiple of the input modulating signal by supply voltage S. The signal which controls modulator 17 is, therefore, substantially independent of the fluctuations in the supply voltage. The switching modulating signal appears at the output port of the amplifier. This switching modulating signal, when used to switch a pulse duration modulator, provides a signal at the output of the modulator which is independent of the supply voltage.

Malec, "*Distortion Correction for an Amplifier System,*" U.S. Pat. No. 5,150,072 (1992), shows in FIG. 1 a divider 39 which receives two inputs. One is input audio signal 12 with a DC level added to it by analog processing circuit 33. The other input is a sample voltage V1 originating from the line voltage source 19, the ac proponent of which has been optimally phase adjusted by correction circuit 41. Analog divider circuit 39 combines these inputs such that the input audio signal is divided by the sample voltage V1. The output is then passed to a digitizer 16 through an A-to-D converter 37 and then provided to amplifiers PA1–PAn at their inputs. In this manner, distortion due to ac components and the voltage source 19 are cancelled.

Holmes, Jr., "*AC Amplifier with Automatic DC Compensation,*" U.S. Pat. No. 5,115,205 (1992), was cited for showing incorporation of the wave shaping feedback system to control the input to a pulse width modulator. As best depicted in FIG. 2, output ports A and B of pulse width modulator 26 drive analog switches 54 and 56 such that voltages V+ and V− are alternately fed back via junction 58 to the input. This feedback signal combines with the signal from sine wave oscillator 12 to feed input 16 of air amplifier 14. The effect of the feedback scheme is to reduce or eliminate the net DC voltage applied to output transformer T1. Nevertheless, any divider function operated in the analog domain has a very limited accuracy and dynamic range.

In conventional PWM approaches, the original signal is converted into pulses whose duration is proportional to the original signal. In the digital domain, this can be achieved by taking the sample amplitude of the signal and using its value to determine the length of a pulse of constant amplitude. The counter is loaded with required data volume and clocked until empty. When the counter starts, the output is set and when the counter finishes, the output is reset. For a 16-bit word arriving at the rate of 44.1 kHz as in a music compact disc, a counter rate of 2.89 GHz is required. Various prior art schemes have been used to reduce the clock rate to a practical range while maintaining the original resolution.

The prior art concept of noise shaping is to express a signal with fewer bits than the given audio band quality would require. The requantization error is modified so that the noise flow in the audio band is reduced at the expense of noise elsewhere.

A noise shaping digital-PWM power amplifier typical of the prior art is shown in FIG. 1. The amplifier, generally drawn by reference numeral 10, includes an interpolator 12, a noise shaper 14, a pulse width modulator 16, a push-pull converter 18, a precision DC power source 20 and a low-pass power filter 22. The digital input signal has a resolution of b bits and a carrier frequency of $f_c$. The input signal is interpolated to a sampling rate by L times. The interpolated signal of b bits with a frequency $Lf_c$ is passed to noise shaper 14 and the noise shape signal of b' bits is obtained with a lower resolution, i.e., b'<b, which is then converted to a pulse width modulated signal by modulator 16. The pulse width modulation is typically implemented by a counter clock with a frequency proportional to $2_{b'} \cdot L$.

A typical prior art noise shaper is illustrated in FIG. 2. The signal X on input line 24 has b bits and the output signal on output line 26 has b' bits. FIG. 2 diagrammatically illustrates the insertion of noise shaping error, $e_{ns}$, and requantization error, $e_{rq}$. To be shown at the square of the noise transfer function has the same shape as the power spectral density of the output error, $e_{ns}$, assuming that the requantization error closely approximates white noise. If element 28 is a high-pass filter, the requantization noise in the audio band will be attenuated by the noise transfer function. With this noise shaping scheme, it is possible to reduce the counter clock frequency substantially.

For example, using an 8 times over sampling rate and a 4th order noise transfer function, namely assuming that filter 28 is a 4th order high-pass filter, an original 16-bit signal can be reduced to 8 bits, and therefore implemented with a counter clock frequency of 90.3 MHz while the output signal-to-noise ratio in the audio band remains the same. This scheme, however, requires a high precision DC power source as shown in FIG. 1 in order to achieve high fidelity.

One prior art scheme to avoid the use of high precision DC power sources called for a feed forward path using a buck converter for ripple reduction. The power source voltage, $v_s$, is sensed to modulate the amplitude of the sawtooth in the ripple. For a constant input signal $v_i$, when the power source voltage steps up, the sawtooth becomes steeper and the duty ratio changes in an attempt to reject the input voltage perturbation. The slope of the sawtooth is proportional to the power source voltage. However, when the power source contains ripple, the so-called "sawtooth" is no longer linear in the manner just described. The workable dynamic range of the power source voltage is limited since the height of the sawtooth is limited by its power supply. FIG. 3 is a wave diagram showing the power source voltage on line 30, the sawtooth wave form of the buck converter on line 32 and the resulting PWM signal on line 34.

What is needed is some type of circuit or approach in which low cost unregulated power supplies, having a substantial ripple content, can be used with a digital PWM amplifier without the ripple distortion caused by the unregulated power supply appearing in the output of the digital PWM amplifier.

Therefore, what is needed is a digital-PWM power amplification technique featuring noise and ripple shaping for audio power amplification.

BRIEF SUMMARY OF THE INVENTION

The invention is an improvement in a digital pulse-width-modulated audio power amplifier having a substantially unregulated power source and one power switch, two complementarily driven power switches for generating a digital PWM output signal, or four power switches in a bridge configuration. The improvement comprises an analog-to-digital converter having an input coupled to the unregulated power source. A digital divider having a dividend input, x, is coupled to a digital audio input signal and a digital divisor input, y, is coupled to an output of the analog-to-digital converter to generate a quotient output signal, x/y. A noise shaper selectively filters the quotient output signal, x/y, from the digital divider. A pulse-width modulator has an input coupled to an output of the noise shaper. The pulse-width modulator has an output coupled to the power switches in the power amplifier to control complementary switching of the power switches so that a power amplified output signal corresponding to the digital input signal is generated without distortion notwithstanding ripple on the unregulated power source.

The improvement further comprises an interpolator having an input coupled to the digital audio input signal and an output coupled to the dividend input, x, of the digital divider so that distortion on the digital audio amplifier is substantially reduced.

The noise shaper is a high-pass filter of order n, which in the illustrated embodiment is a 4th order filter. The interpolator has an over sampling rate at least 8 times.

The invention is also characterized as a digital pulse-width modulated audio power amplifier comprising an unregulated power source, a digital pulse-width modulated switching amplifier and an analog-to-digital circuit coupled to the unregulated power source for generating a feed forward digital signal corresponding to the power source voltage. A digital divider is coupled to the analog-to-digital circuit and divides a digital input signal by the digital output signal generated by the analog-to-digital circuit corresponding to the unregulated power source voltage. A pulse-width modulator is coupled to the divider circuit and generates a pulse-width modulated signal to control the switching amplifier. The pulse-width modulator is coupled to a control input of the switching amplifier. As a result, digital signal power amplification is provided with substantial ripple from the unregulated power source.

The invention is further defined as a method for providing digital power amplification comprising providing a digital input signal, selectively generating a power source ripple modulation signal, and generating a digital output signal modulated by the power source modulation signal. The output signal has an amplitude modulated by the power source modulation signal. The power source modulating signal is shaped by power source ripple so that power source ripple content is removed from the output spectrum of the digital output signal.

Generating the digital output signal modulated by the power source modulation signal comprises generating a pulse width modulation signal as a control signal to a digital-pulse width modulated power amplifier. The modulation signal is shaped by the power source ripple so that the pulse-width modulated control signal has narrower pulses than the digital input signal indicated when the power source voltage amplitude is high. The pulse-width modulated control signal has wider pulses than the digital input signal indicated when the power source voltage amplitude is low. As a result, the power source ripple is substantially eliminated from the digital output signal.

More specifically generating the digital output signal modulated by the power source modulated signal comprises providing a digital feed forward signal corresponding to the power source ripple, dividing the digital input signal by the digital feed forward signal, and generating the pulse-width modulated control signal from the divided digital input signal.

Generating the digital output signal further comprises interpolating the input signal prior to being divided by the feed forward digital signal to over-sample the digital input signal to reduce bit resolution. The divided input signal is noise shaped prior to generating pulse width modulated control signal.

The invention can now be better visualized by turning to the following drawings wherein like elements are referenced by like numerals.

The invention and its various embodiments can now be understood by turning to the following detailed description.

DETAILED DESCRIPTION OF THE PREFERRED EMBODIMENTS

A digital, pulse-width modulated (PWM) audio power amplifier and method for power amplification which includes noise and ripple shaping is provided by generating a sampled power-source amplitude signal. The sample power-source amplitude signal is used to shape the interpolated input digital signal, which is fed to a noise shaper to produce a lower bit, digital signal to represent the original signal. The output power signal is not affected by the requantization error or the power-source ripple. Therefore, high precision DC power regulators normally used for such audio power amplifiers can be eliminated without any sacrifice in the noise-to-signal ratio.

Figure 4:
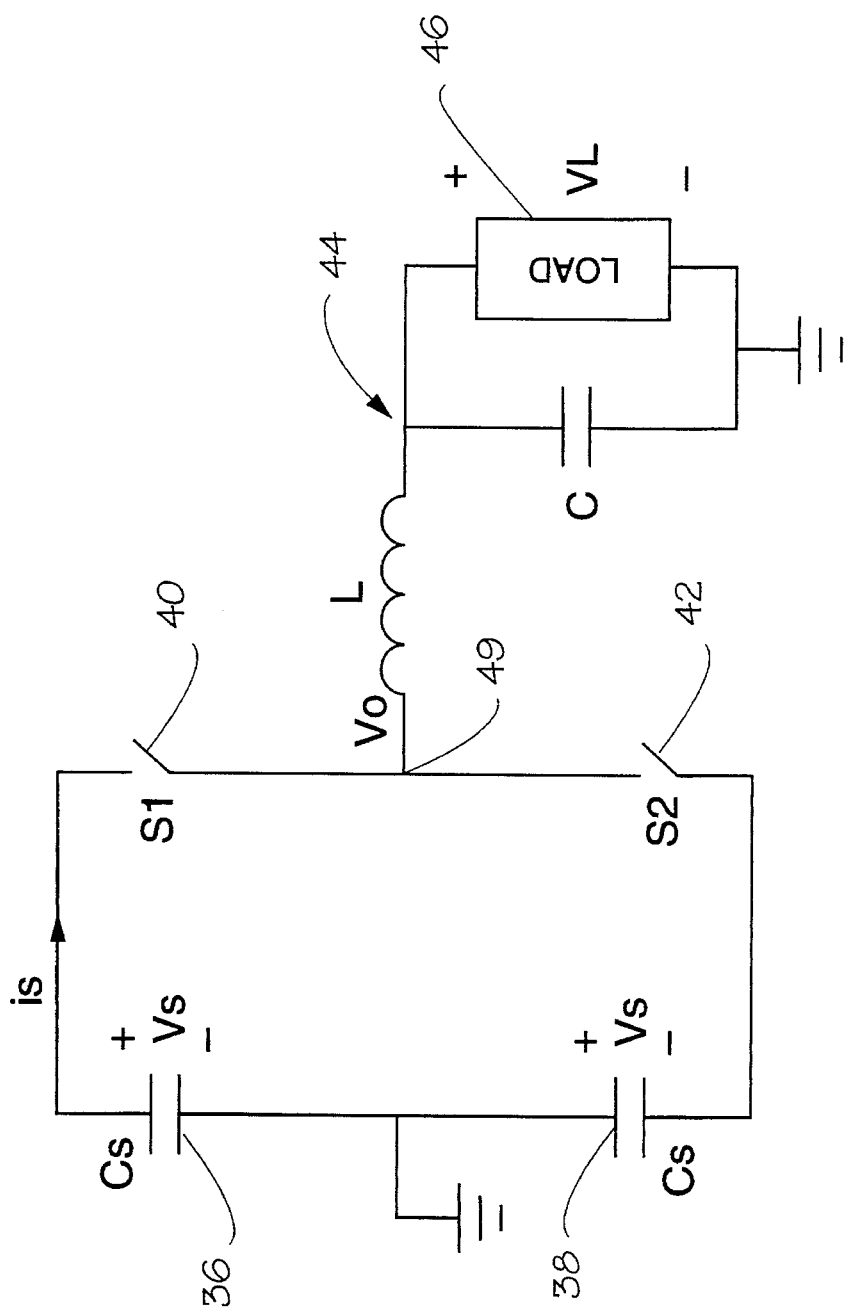
FIG. 4 is a simplified schematic of a conventional, prior art push-pull converter.

The noise and ripple shaping technique of the invention is based upon the combination of the noise shaping concept with digital ripple feed forward compensation in order to realize digital domain power amplification. A push-pull converter is shown in FIG. 4 as being comprised of two power capacitors 36 and 38, two power switches 40 and 42, an output low-pass power filter, generally denoted by reference numeral 44, and a generic load 46. In the case of an audio compact disk player, load 46 is the speakers. This technique is suitable for many other types of converters, such as single ended converters, and full bridge converters.

Switches 40 and 42 are complementary so that switch 40 is off when switch 42 is on and vice versa. LC low-pass filter 44 attenuates the switching frequency. It can be shown that output 48, $v_o$, of the circuit of FIG. 4, is approximately equal to the input voltage times the power source voltage, $v_s$. It can then be shown that the pulse widths of the PWM output waveform, $v_o$, is modulated by the input audio signal, $v_i$, and its amplitude is modulated by the power source voltage, $v_s$. In other words any ripple on the power source voltage, $v_s$, appears on the output, $v_o$, multiplied by the voltage amplitude of the power source, $v_s$.

Figure 5:
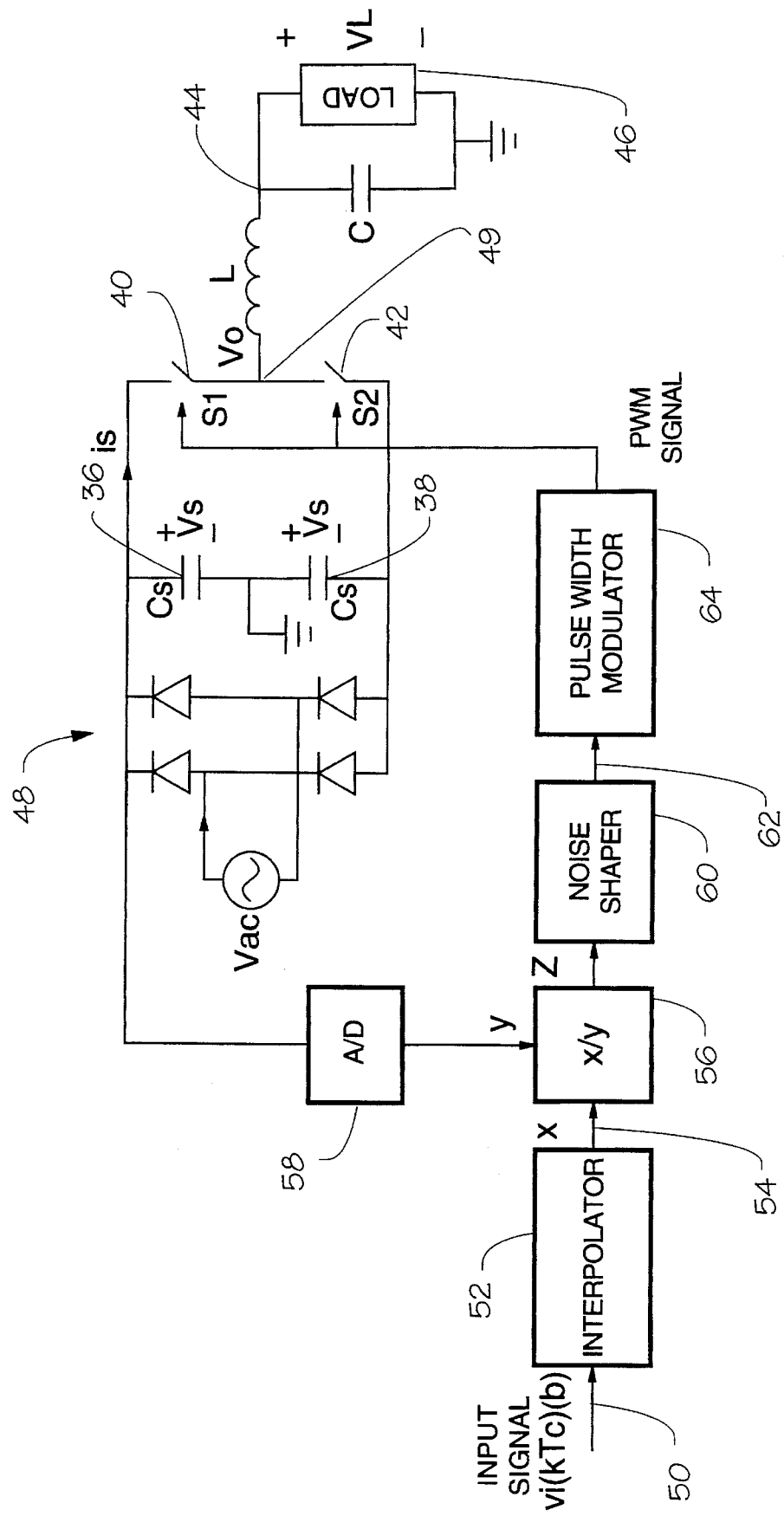
FIG. 5 is a simplified block diagram and schematic of a circuit incorporating the invention.

Turn now to FIG. 5 wherein the concept of a digital PWM audio power amplifier with noise and ripple shaping according to the invention is schematically depicted in partial block diagram using a push-pull converter, as illustrated in FIG. 4. In this case, the push-pull converter is provided with an unregulated bridge rectifier, generally noted by reference numeral 48, although any type of DC power supply now known or later devised could be equivalently substituted. The point is simply made that a simple unregulated power supply can be utilized in a digital power amplifier while still obtaining extremely high fidelity.

The digital input signal, $v_i$, is input on line 50. The digital audio input, $v_i$, is interpolated by interpolator 52 to create an over-sampled digital signal on output 54, symbolically denoted as x. The over-sampled digital audio signal is then digitally divided by divider 56. The digital divisor input, the ripple bearing signal, symbolically denoted by y, is provided through an analog-to-digital converter 58 coupled to the output of the unregulated power supply 48. The divided signal, symbolically denoted by x/y, is passed to a nonlinear noise shaper 60. The b' bit output signal on output line 62 from nonlinear noise shaper 60 is then digitally converted to a pulse-width-modulated signal by pulse width modulator 64. The PWM output signal from pulse width modulator 64 is used as the control or gate signal for complementary switches 40 and 42.

As before, LC low-pass power filter 44 attenuates the switching frequency of switches 40 and 42. Ripple in the DC power source 48 is rejected in the circuit of FIG. 5. With this noise and ripple shaping configuration, the power amplifier does not need a precision DC power source. A rectified, but unregulated DC power source, that contains ripple content from the line is utilized. In addition, the power capacitors 36 and 38 can be smaller than normally used to provide minimum filtering and may be removed entirely if, for example, a three-phase bridge rectifier is used in place of the conventional full-wave rectifier 48 shown in FIG. 5.

The effective input signal carried in the input digital data is $v_i(t)$, the effective signal carried in the sampled power source voltage is $v_s(t-T_d/2)$ where $T_d/2$ is a delay induced by the uniform sampling and calculation process. The effective output signal is then $$v_o(t)=v_i(t)v_s(t)/\ v_s(t-T_d/2)$$

This expression can be simplified to show that the output signal $v_o$ is equal to the input signal $v_i$ plus a function which is the product of $v_i$ and various distortion or error terms caused by the power source ripple. It turns out that the error is bounded by a function proportional to the sampling period, $T_s$. Therefore, the error becomes smaller when the sampling frequency, $f_s$, increases. It is therefore advantageous to use an interpolator 52 disposed in front of divider 56, because the switching frequency $f_s$ is equal to $L\,f_c$ where $f_c$ is the carrier frequency. This reduces the error caused by the ripple by a factor of L over that obtained with divider 56 used without combination with interpolator 52.

Figure 1:
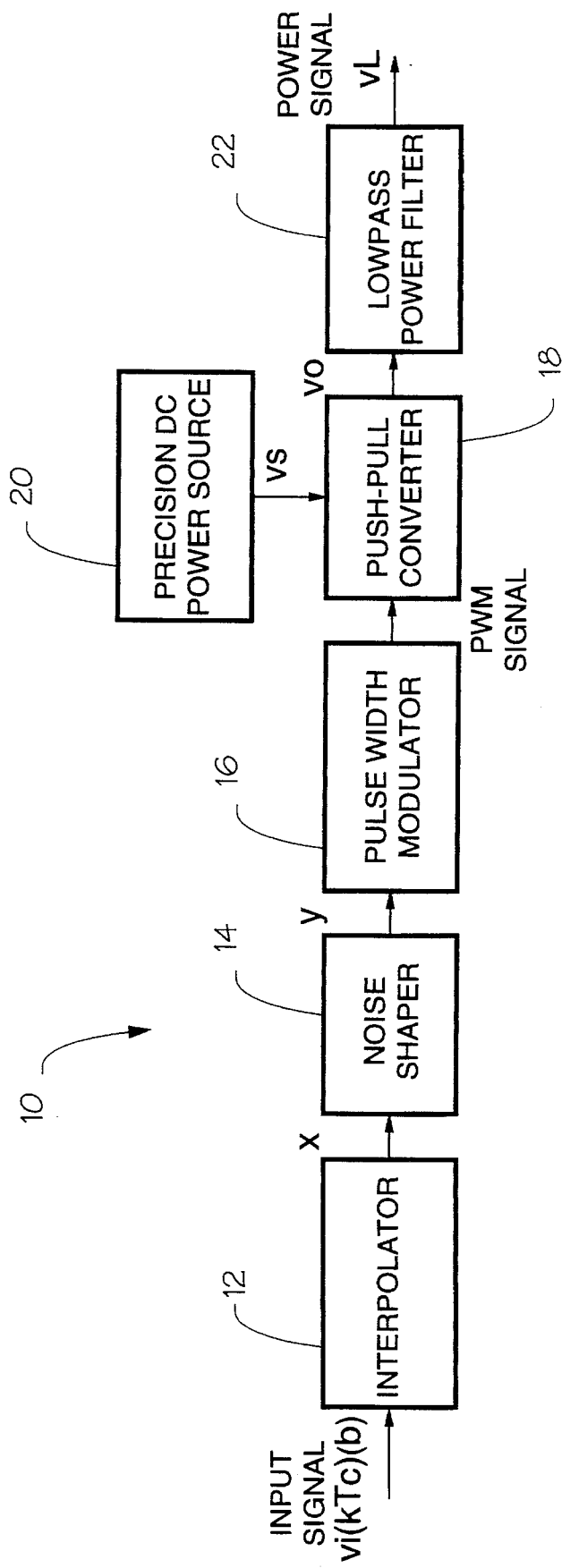
FIG. 1 is a block diagram of a prior art digital-PWM power amplifier with noise shaping circuitry.
Figure 2:
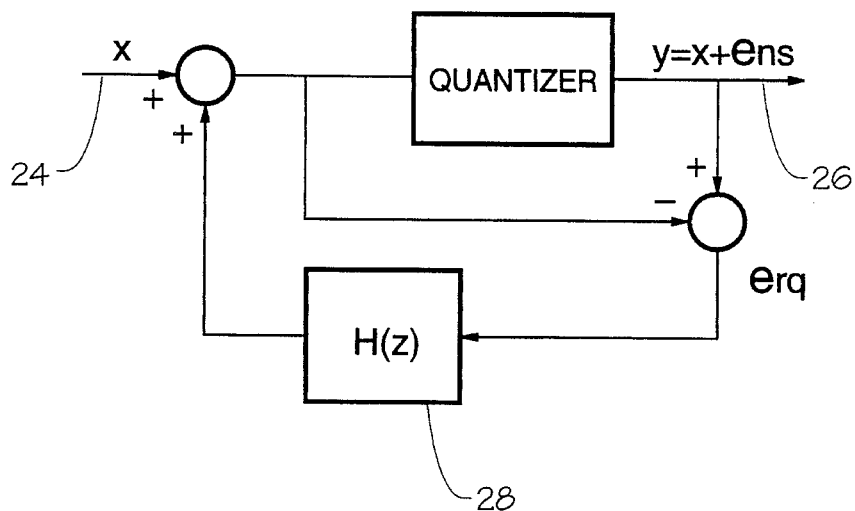
FIG. 2 is a block diagram on a prior art noise shaping circuit.
Figure 3:
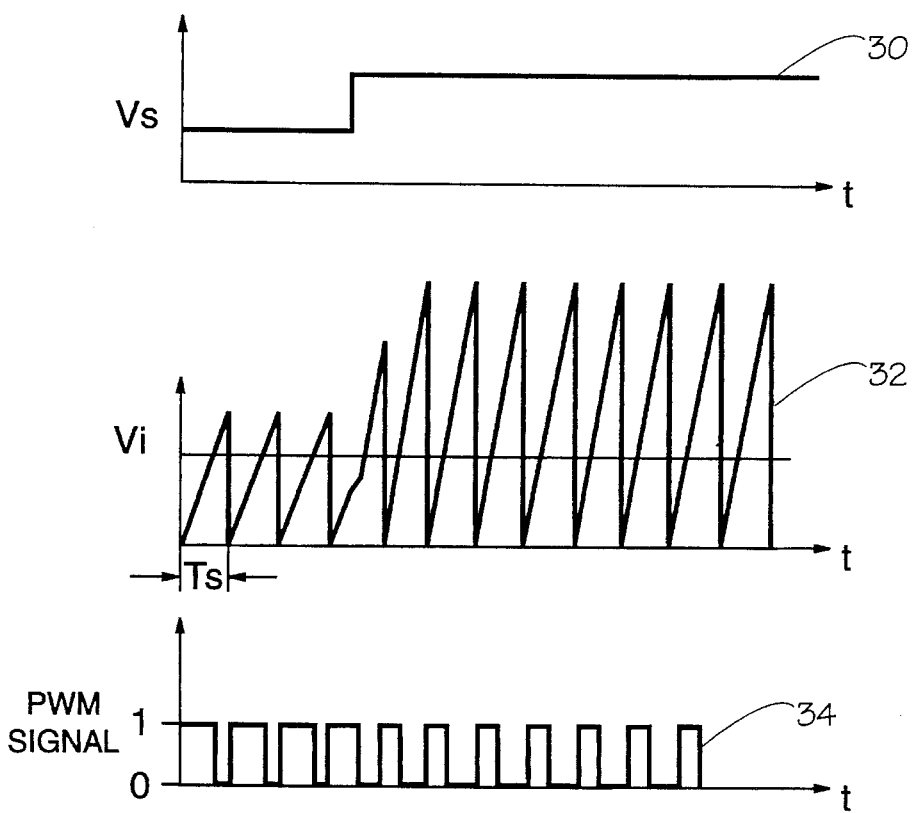
FIG. 3 is a wave diagram showing the prior art use of a feed forward sawtooth for ripple shaping.
Figure 6A:
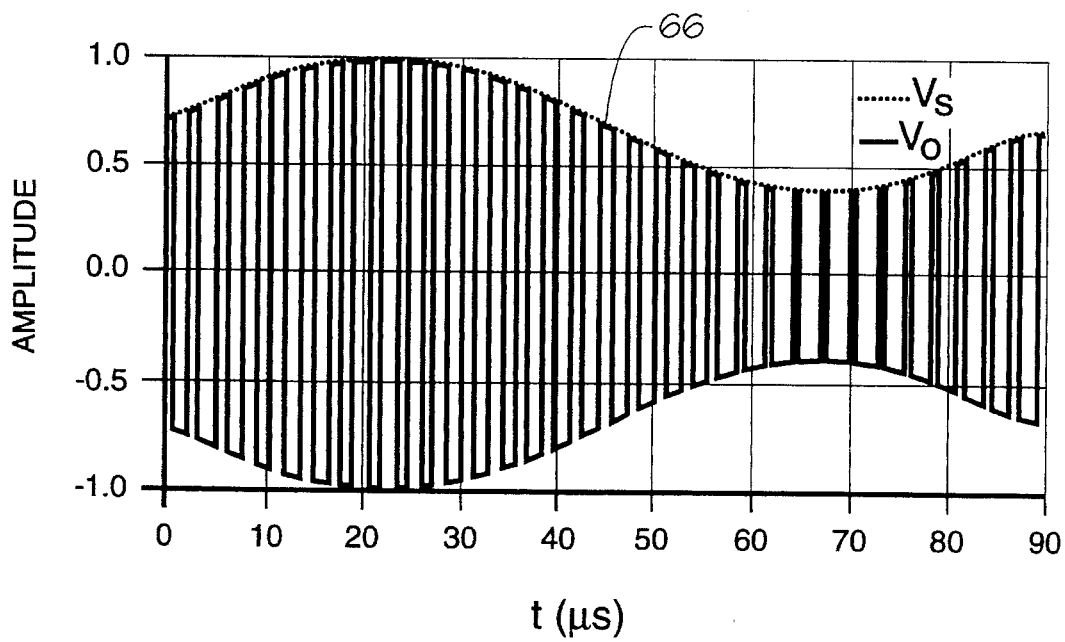
FIGS. 6a is a wave diagram showing an output PWM waveform with noise shaping only according to the prior art and FIG. 6b is a wave diagram showing an output PWM waveform with noise and ripple shaping according to the invention.

The operation of the invention in the circuitry of FIG. 5 can be better understood and contrasted to the operation of the prior art circuit shown in FIG. 4 by comparing the wave diagrams of FIGS. 6a,b, 7a,b and 8a,b. In the illustrated embodiment FIG. 6a shows a digital audio signal having a carrier frequency of 44.1 kHz as is characteristic for digital music compact discs with a resolution of 16 bits. Assume that interpolator 12 in the prior art circuit of FIG. 1 has an over sampling rate of 8 and uses a noise shaping filter 14, which is a 4th order high-pass filter to reduce the resolution of the final digital signal to 8 bits. Assume further that the power source, $v_s$, has a ripple in it as depicted by the envelope contour 66 as shown in FIG. 6a.

Figure 7A:
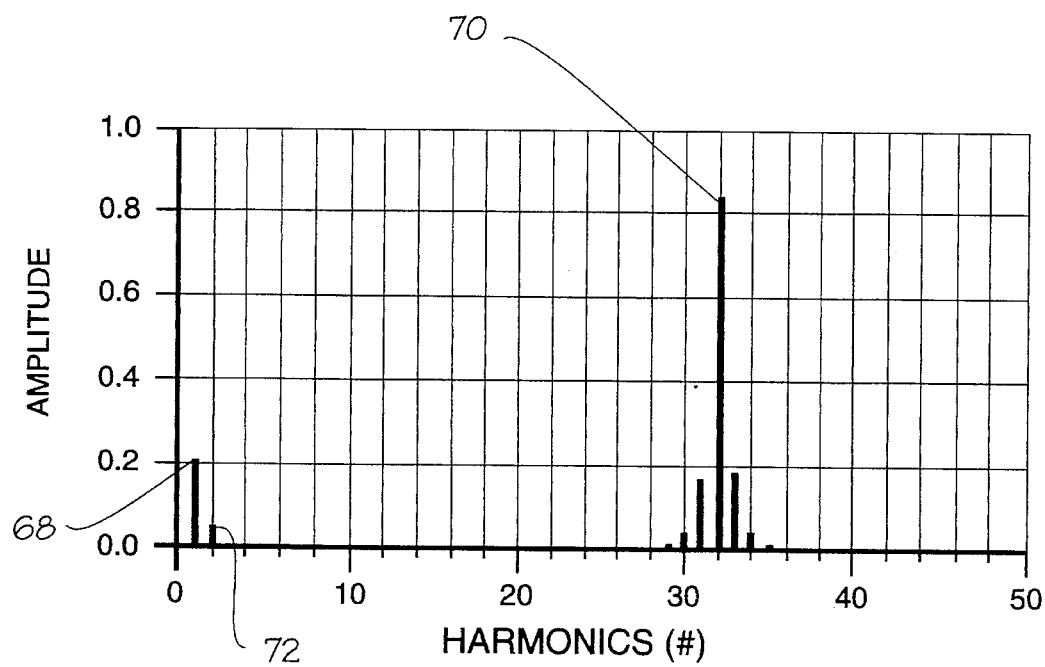
FIGS. 7a and b are wave diagrams showing the spectral output of the signals of FIG. 6a and b respectively.
Figure 8A:
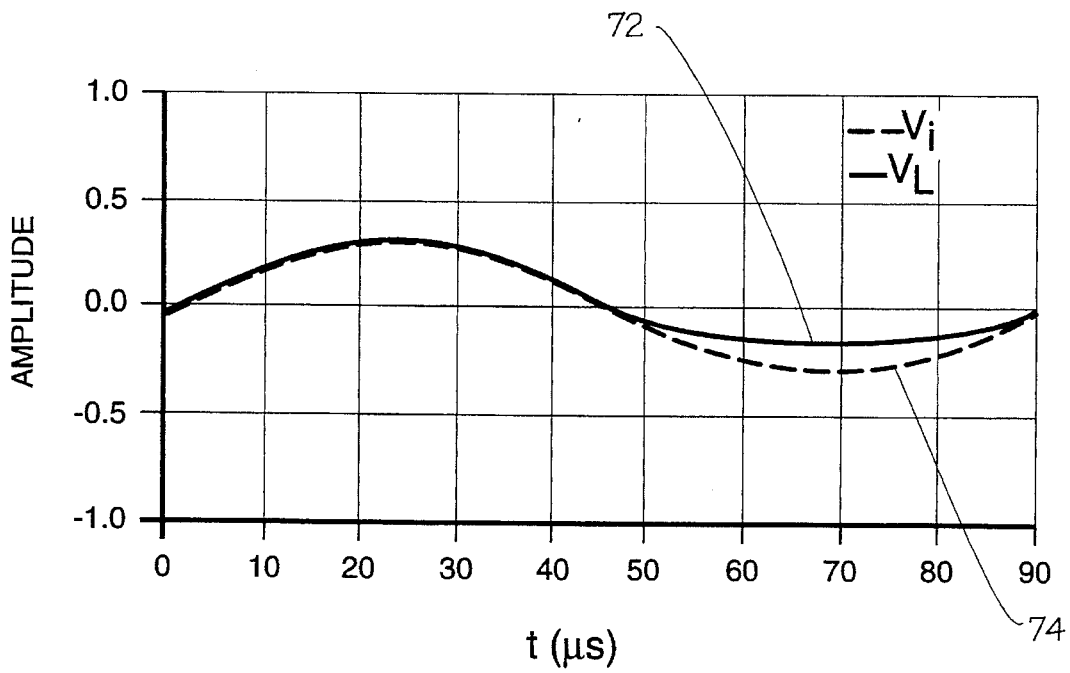
FIGS. 8a and b are wave diagrams showing the load voltage waveform of the signals of FIG. 6a and b respectively.

The depicted output waveform using noise shaping only as used in the prior art and as shown in FIG. 6a assumes a fundamental frequency for the audio signal of 11.25 kHz. The spectrum of the output signal $v_o$ shown in FIG. 6a is depicted in FIG. 7a where the amplitude of each of the harmonics are shown as a bar graph. The fundamental 11.25 kHz tone is shown by spike 68 with a second harmonic 72 and others higher order harmonics around the switching frequency are shown to the right centered about a prominent 32nd harmonic. The resulting load voltage, $v_L$, after the output signal is passed through a low-pass filter to attenuate the switching frequency and its side bands is shown in FIG. 8a as a function of time on curve 72 for the 11.25 kHz tone. The original input signal is shown on curve 74. The gap between curves 72 and 74 graphically illustrates the output power signal distortion.

Figure 6B:
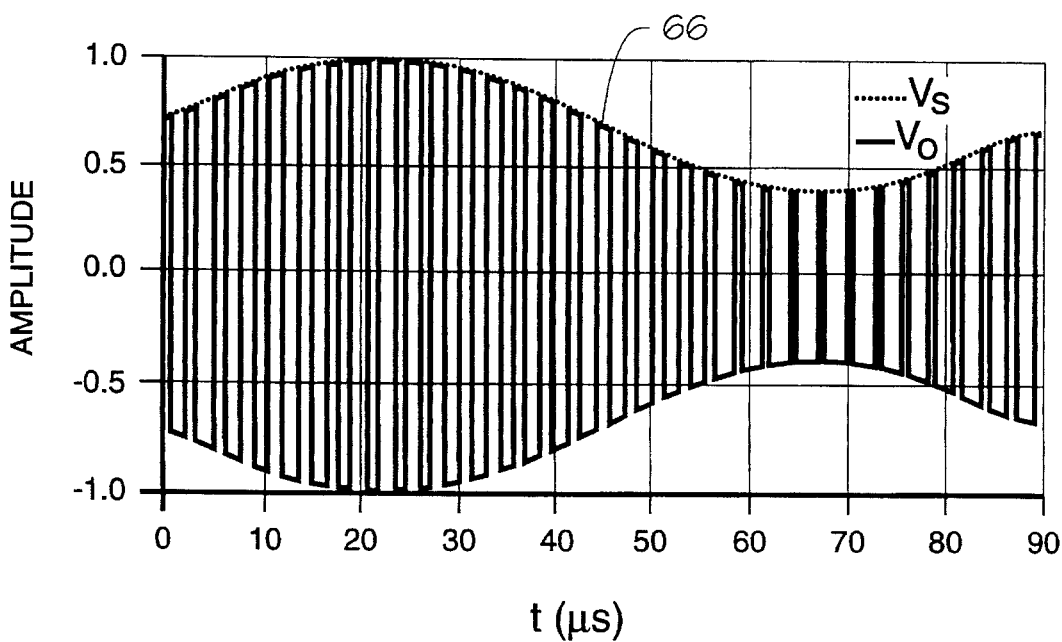

Turn now and consider the exact same signal as power amplified at a circuit devised according to the invention by the circuit illustrated in FIG. 5. The same signal with a carrier frequency of 44.1 kHz having a 16-bit resolution is passed through the 8 times interpolator and a 4th order noise shaping filter to reduce the resolution of the final digital signal to 8 bits. The same power source ripple is assumed in FIG. 6b as in FIG. 6a. The output waveforms, although appearing similar in FIGS. 6a and b are in fact different.

Figure 7B:
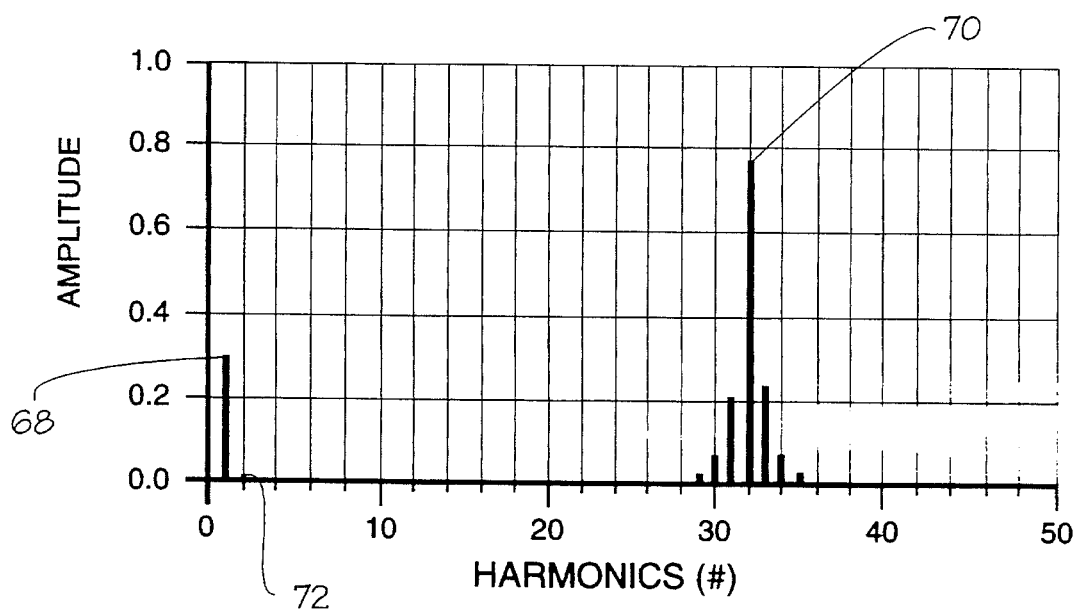

The output spectrum with the noise and ripple shaping invention is depicted in FIG. 7b. Here again, the fundamental tone is shown by spike 68, but the 2nd harmonic is missing and there is a different spectrum distributed about the 32nd harmonic 70, shown here as ranging from the 29th to the 35th harmonic.

Figure 8B:
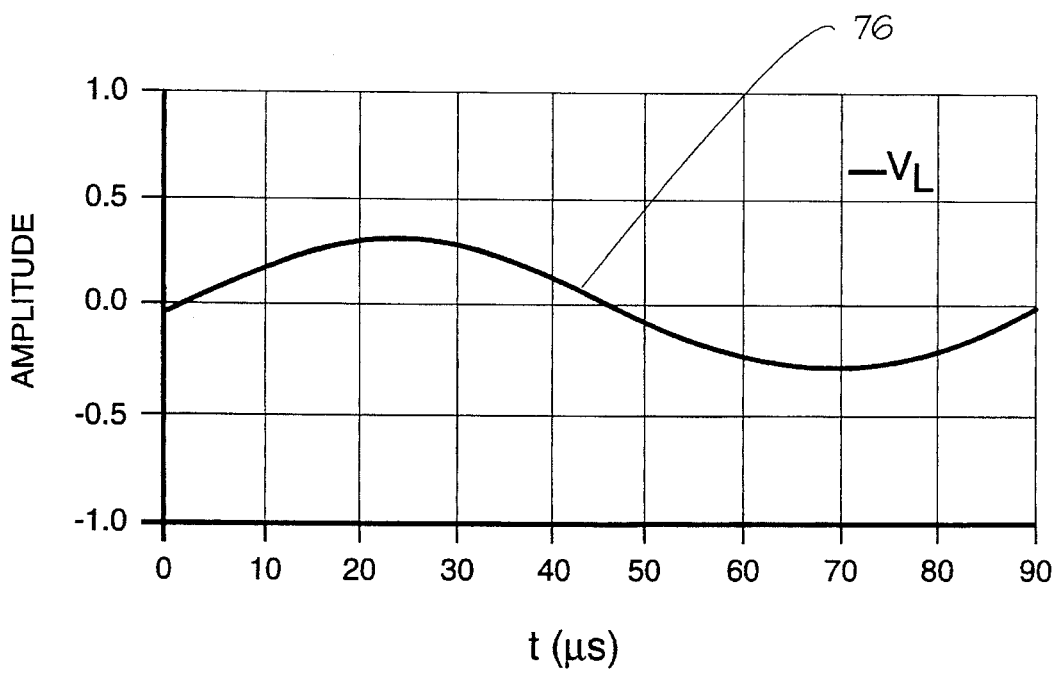

The input and output load voltages are shown in FIG. 8b by curve 76 as being superimposed, graphically illustrating in comparison with FIG. 8a that the distortion between the input voltage and the output voltage has been substantially removed or eliminated.

In summary, the operation of the invention can be understood as follows. The power source ripple modulates the amplitude of the output pulses. However, the power source ripple content is not found in the output spectrum, because the modulation signal has been shaped by the power source ripple. The pulse width of the PWM signal of the invention is narrower than the pulse width of the PWM indicated by the original input signal when the power source amplitude is high, and the pulse width is wider than the pulse width of the PWM indicated by the original input signal when the power source amplitude is low. Therefore, the effect of the power source ripple is eliminated from the output signal.

This example demonstrates the effectiveness of the noise and ripple shaping technique of the invention. The output power signals are not affected by the power source ripple and disturbance. Therefore, the DC regulator within precision DC power source 20 in FIG. 1 can be eliminated and the size of the low-pass power filter can be reduced without sacrificing the quality of the output signal.

It is highly desirable to be able to do digital-PWM power amplification, since all signals are processed in the digital domain. The extra digital-to-analog conversion and its associated sample and hold and sharp cutoff analog low-pass filter are no longer required. Through the use of noise and ripple shaping, fewer bits are sufficient to provide sufficient quality in the audio band and hence, the clock rate needed in the power amplifier is reduced to a more practical and achievable level. In addition, a conventional and simple unregulated DC power source 48 is sufficient and provides very low power distortion in the output signal.

Figure 9:
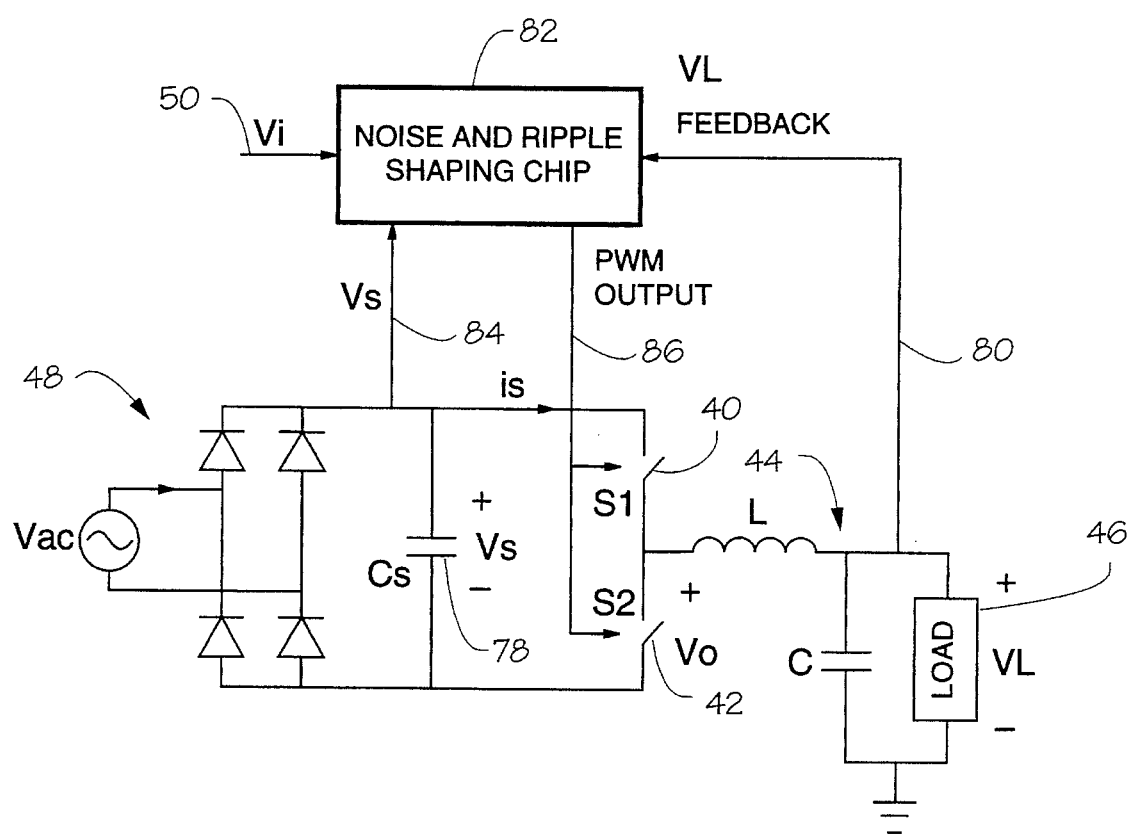
FIG. 9 is a simplified block diagram and schematic showing an integrated circuit design equivalent to the circuit of FIG. 5.

Because of these advantages, a fully integrated digital circuit such as that shown in FIG. 9 can thus be devised. A conventional full-wave rectifier bridge, generally denoted again by reference to numeral 48, is used to provide a power source across a power capacitor 78 and two switches 40 and 42 to a conventional low-pass output filter 44 and generic load 46, such as a speaker. Audio feedbacks are provided on feedback line 80 to the noise and ripple shaping chip 82 which takes as its other inputs the digital input signal 50 and $v_s$, the unregulated power source voltage 82. The signals on lines 50 and 82 are then combined within noise and ripple shaping chip 82 in the manner as described in connection with FIG. 5 to provide a PWM output signal 86 provided as a control signal to complementary switches 40 and 42 to drive the load.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. An improvement in a digital pulse-width-modulated audio power amplifier having a substantially unregulated power source and a power switch for generating a digital PWM output signal comprising:

an analog-to-digital converter having an input coupled to said unregulated power source;

a digital divider having a dividend input, x, coupled to a digital audio input signal and a digital divisor input, y, coupled to an output of said analog-to-digital converter to generate a quotient output signal, x/y;

a noise shaper for selectively filtering said quotient output signal, x/y, from said digital divider; and a pulse-width modulator having an input coupled to an output of said noise shaper, said pulse-width modulator having an output coupled to said power switch in said power amplifier to control switching of said power switch so that a power amplified output signal corresponding to said digital input signal is generated without distortion notwithstanding ripple on said unregulated power source.

2. The improvement of claim 1 further comprising an interpolator having an input coupled to said digital audio input signal and an output coupled to said dividend input, x, of said digital divider so that distortion on said digital audio amplifier is substantially reduced.

3. The improvement of claim 1 wherein said noise shaper is a high-pass filter of order n.

4. The improvement of claim 2 wherein said noise shaper is a high-pass filter of order n.

5. The improvement of claim 3 wherein said order n of said high-pass filter is 4.

6. The improvement of claim 4 wherein said order n of said high-pass filter is 4.

7. The improvement of claim 2 wherein said interpolator has an over sampling rate at least 8 times.

8. The improvement of claim 4 wherein said interpolator has an over sampling rate at least 8 times.

9. A digital pulse-width modulated audio power amplifier comprising:

an unregulated power source;

a digital pulse-width modulated switching amplifier;

an analog-to-digital circuit coupled to said unregulated power source for generating a feed forward digital signal corresponding to said power source voltage;

a digital divider coupled to said analog-to-digital circuit for dividing a digital input signal by said digital output signal generated by said analog-to-digital circuit corresponding to said unregulated power source voltage; and a pulse-width modulator coupled to said divider circuit for generating a pulse-width modulated signal to control said switching amplifier, said pulse-width modulator being coupled to a control input of said switching amplifier, whereby digital signal power amplification is provided without substantial distortion from said unregulated power source.

10. A digital pulse-width modulated audio power amplifier comprising:

an unregulated power source;

a digital pulse-width modulated switching amplifier;

an analog-to-digital circuit coupled to said unregulated power source for generating a feed forward digital signal corresponding to said power source voltage;

a digital divider coupled to said analog-to-digital circuit for dividing a digital input signal by said digital output signal generated by said analog-to-digital circuit corresponding to said unregulated power source voltage;

a pulse-width modulator coupled to said divider circuit for generating a pulse-width modulated signal to control said switching amplifier, said pulse-width modulator being coupled to a control input of said switching amplifier; and a noise shaping circuit having an input coupled to said divider and an output coupled to said pulse-width modulator, said noise shaping circuit for filtering noise inserted into said output from digital divider, whereby digital signal power amplification is provided without substantial distortion from said unregulated power source.

11. The amplifier of claim 10 wherein said noise shaping circuit is a high-pass filter.

12. The amplifier of claim 11 wherein said noise shaping circuit is a high-pass filter of order 4.

13. A digital pulse-width modulated audio power amplifier comprising:

an unregulated power source;

a digital pulse-width modulated switching amplifier;

an analog-to-digital circuit coupled to said unregulated power source for generating a feed forward digital signal corresponding to said power source voltage;

a digital divider coupled to said analog-to-digital circuit for dividing a digital input signal by said digital output signal generated by said analog-to-digital circuit corresponding to said unregulated power source voltage;

a pulse-width modulator coupled to said divider circuit for generating a pulse-width modulated signal to control said switching amplifier, said pulse-width modulator being coupled to a control input of said switching amplifier; and an interpolating circuit for over-sampling the digital input signal and providing an output digital signal of reduced bit resolution for coupling to said digital divider, whereby digital signal power amplification is provided without substantial distortion from said unregulated power source.

14. The amplifier of claim 13 wherein said interpolator is an 8 times over-sampling interpolating circuit.

15. The amplifier of claim 9 wherein said digital switching amplifier drives a load impedance through a low-pass filter, said low-pass filter for attenuating the switching frequency of said switching amplifier.

16. The amplifier of claim 13 wherein said digital switching amplifier drives a load impedance through a low-pass filter, said low-pass filter for attenuating the switching frequency of said switching amplifier and further comprising a noise shaping circuit having an input coupled to said divider and an output coupled to said pulse-width modulator, said noise shaping circuit for filtering noise inserted into said output from digital divider.

17. A method for providing digital power amplification comprising:

providing a digital input signal;

selectively generating a power source ripple modulation signal; and generating a digital output signal modulated by said power source modulation signal, said output signal having an amplitude modulated by said power source modulation signal, the power source modulating signal being shaped by power source ripple so that power source ripple content is removed from the output spectrum of said digital output signal.

18. A method for providing digital power amplification comprising:

providing a digital input signal;

selectively generating a power source ripple modulation signal;

generating a digital output signal modulated by said power source modulation signal, said output signal having an amplitude modulated by said power source modulation signal, the power source modulating signal being shaped by power source ripple so that power source ripple content is removed from the output spectrum of said digital output signal; and where generating said digital output signal modulated by said power source modulation signal comprises generating a pulse width modulation signal as a control signal to a digital-pulse width modulated power amplifier, said modulation signal being shaped by said power source ripple so that said pulse-width modulated control signal has narrower pulses than said digital input signal when said power source voltage amplitude is high, and so that said pulse-width modulated control signal has wider pulses than said digital input signal when said power source voltage amplitude is low, whereby said power source ripple is substantially eliminated from said digital output signal.

19. The method of claim 18 where generating said digital output signal modulated by said power source modulated signal comprises:

providing a digital feed forward signal corresponding to said power source ripple;

dividing said digital input signal by said digital feed forward signal; and generating said pulse-width modulated control signal from said divided digital input signal.

20. The method of claim 19 where generating said digital output signal further comprises:

interpolating said input signal prior to being divided by said feed forward digital signal to over-sample said digital input signal to reduce bit resolution; and noise shaping said divided input signal prior to generating pulse width modulated control signal.

* * * * *